US011604221B1

(12) United States Patent
Pradeep et al.

(10) Patent No.: US 11,604,221 B1
(45) Date of Patent: Mar. 14, 2023

(54) CLOCK SHAPER CIRCUIT FOR TRANSITION FAULT TESTING

(71) Applicant: TEXAS INSTRUMENTS INCORPORATED, Dallas, TX (US)

(72) Inventors: Wilson Pradeep, Bangalore (IN); Sriraj Chellappan, Bangalore (IN); Shruti Gupta, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/566,190

(22) Filed: Dec. 30, 2021

(51) Int. Cl.
*G01R 31/317* (2006.01)
*G01R 31/3177* (2006.01)
*G11C 19/28* (2006.01)
*H03K 19/20* (2006.01)

(52) U.S. Cl.
CPC ... *G01R 31/31727* (2013.01); *G01R 31/3177* (2013.01); *G11C 19/287* (2013.01); *H03K 19/20* (2013.01)

(58) Field of Classification Search
CPC .......... G01R 31/31727; G01R 31/3177; G11C 19/287; H03K 19/20
USPC ....................................................... 714/731
See application file for complete search history.

(56) References Cited

U.S. PATENT DOCUMENTS

| 8,438,437 | B2* | 5/2013 | Jain ................ G01R 31/318547 |
| | | | 714/731 |
| 8,971,455 | B2* | 3/2015 | Ganesan ............... H03L 7/1803 |
| | | | 375/376 |
| 9,600,018 | B1* | 3/2017 | Majumdar ................ G06F 1/06 |
| 10,261,128 | B2* | 4/2019 | Kumar ........... G01R 31/318552 |
| 10,651,836 | B1* | 5/2020 | Kale ....................... H03K 5/131 |
| 2008/0222471 | A1* | 9/2008 | Sul .................. G01R 31/318575 |
| | | | 714/731 |
| 2012/0030532 | A1* | 2/2012 | Jain ................ G01R 31/318547 |
| | | | 714/E11.067 |
| 2017/0154585 | A1* | 6/2017 | Lee ...................... G09G 3/2092 |

OTHER PUBLICATIONS

Bechade et al., Digital delay line clock shaper and multipliers, Mar. 1995, IBM, pp. 93-103. (Year: 1995).*

* cited by examiner

*Primary Examiner* — John J Tabone, Jr.
(74) *Attorney, Agent, or Firm* — Krista Y. Chan; Frank D. Cimino

(57) ABSTRACT

An integrated circuit for transition fault testing comprises a synchronizing circuit including a first set of shift registers coupled to receive a scan enable signal and to provide a synchronizing signal based on the scan enable signal; a clock leaker circuit coupled to the synchronizing circuit and including a second set of shift registers coupled to receive a first clock signal based on the synchronizing signal and to provide a second clock signal that includes a set of pulses; and a multiplexer (MUX) that includes a first input coupled to receive a shift clock, a second input coupled to the clock leaker circuit to receive the second clock signal, and an output configured to provide an output clock signal that includes a second set of pulses.

20 Claims, 3 Drawing Sheets

CLOCK SHAPER CIRCUIT FOR TRANSITION FAULT TESTING

BACKGROUND

Continuing improvements in manufacturing technology have enabled incorporating deep sub-micron (DSM) complementary metal-oxide semiconductor (CMOS) technology into large scale integrated circuits to meet area, power, and performance metrics for today's functional applications. These large-scale integrated circuits integrate functional components of a computer system onto a single silicon semiconductor for controlling and managing a wide range of function and useful applications and are often referred to as "system on a chip," or "SoC," devices.

SUMMARY

In accordance with at least one example of the disclosure, an integrated circuit for transition fault testing comprises a synchronizing circuit including a first set of shift registers coupled to receive a scan enable signal and to provide a synchronizing signal based on the scan enable signal; a clock leaker circuit coupled to the synchronizing circuit and including a second set of shift registers coupled to receive a first clock signal based on the synchronizing signal and to provide a second clock signal that includes a set of pulses; and a multiplexer (MUX) that includes a first input coupled to receive a shift clock, a second input coupled to the clock leaker circuit to receive the second clock signal, and an output configured to provide an output clock signal that includes a second set of pulses.

In accordance with at least one example of the disclosure, a method implemented by an integrated circuit comprises receiving, by a synchronizing circuit, a scan enable signal; providing, by the synchronizing circuit, a synchronizing signal based on the scan enable signal; receiving, by a clock leaker circuit, a first clock signal based on the synchronizing signal; providing, by the clock leaker circuit, a second clock signal that includes a set of pulses; receiving, by a multiplexer (MUX), a shift clock at a first input of the MUX and a second clock signal at a second input of the MUX; and providing, by the MUX, an output clock signal that includes a second set of pulses at an output of the MUX.

DETAILED DESCRIPTION

Figure 1:
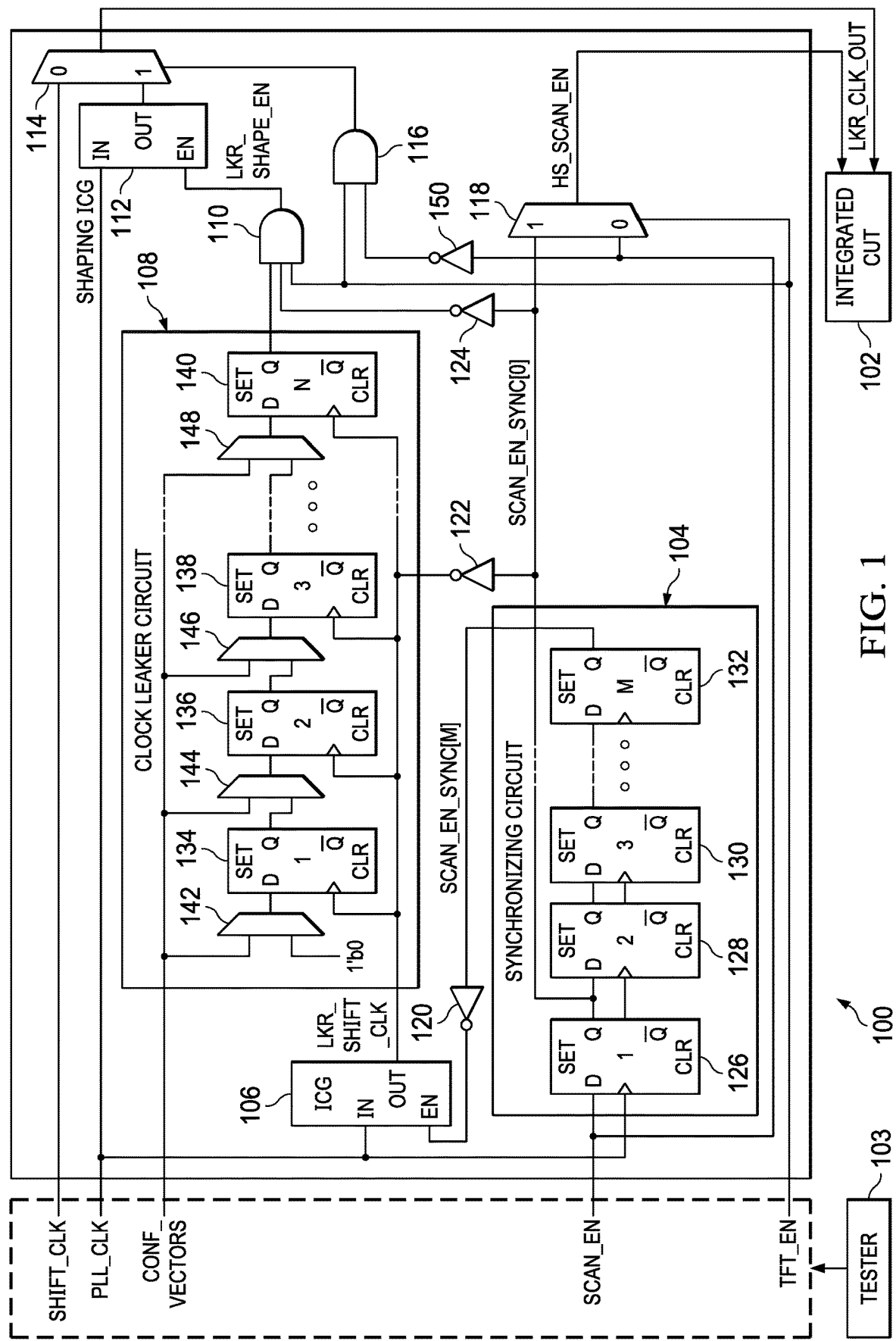
FIG. 1 is a block diagram of an integrated circuit in accordance with various examples.

In DSM processes, defects like high impedance metal, high impedance shorts, and cross talk may not be detectable by traditional stuck-at fault tests, and may only show-up as timing failures via at-speed tests during testing. At-speed tests include transition fault testing and path delay fault testing. During a transition fault test, a mode of operation (e.g., an initialization cycle, a launch cycle, and/or a capture cycle, etc.) may be based on a state (e.g., a state '0' or a state '1') of a scan enable signal. The at-speed scan enable signal controls the mode of operation (e.g., the initialization/shift cycle/phase, the launch phase, and/or the capture phase, etc.). Both of the above at-speed tests input test patterns by scanning them into shift register(s) of a digital logic circuit at a slow speed during the shift phase at a clock frequency that is slower than the functional clock frequency applied during the launch and capture phase. After the test pattern is scanned in during the shift phase, clock pulses are applied at full speed during the launch and capture phases. One clock pulse launches a transition timing operation and a second clock pulse clocks a capture of the output transition for a respective path. The captured result can be scanned out during another shift phase, usually at slow speed and compared with an expected response or programmed value.

Generally, clock shaper circuits (such as clock leaker circuits) are logic circuits that provide a clock pulse or a set of clock pulses (e.g., in a test operation). These clock pulses are useful for transition fault testing or stuck-at fault testing of an integrated circuit-under-test (e.g., a cluster of flip-flops in a SoC) during the test operation. In some examples, clock shaper circuits are useful to provide a single clock pulse during stuck-at fault testing or a set of clock pulses during transition fault testing. In an example, for at-speed transition fault testing, the logic circuits provide the clock pulses to the integrated circuit-under-test (CUT) having a functional clock frequency of the integrated CUT. In an example, the logic circuits may be implemented together with the integrated CUT in a SoC. Further, in a shift phase, the clock shaper circuit receives a logic high scan enable signal that is also provided to the integrated CUT. In the launch and capture phase, the scan enable signal transitions to a logic low to cause the clock shaper circuit to provide a set of clock pulses to the integrated CUT in order to perform transition fault testing on the integrated CUT.

In an at-speed transition fault test of the integrated CUT, automatic test equipment (ATE) (e.g., a tester) loads a test pattern that includes programmed data vectors/scan vectors (e.g., data stream of '1' and '0' bits) into the integrated CUT in the shift phase. The ATE may load each data bit into the integrated CUT at a slow speed responsive to providing a shift clock frequency to the integrated CUT. As used herein, a 'slow speed' indicates clock signals that operate at a lower frequency than a functional clock frequency of clock signals (e.g., from a phase-locked loop (PLL) clock) provided to the integrated CUT and that corresponds to the operating frequency of the integrated CUT. In the shift phase, the ATE also applies a logic high (e.g., logic 1) scan enable signal to a clock shaper circuit and to the integrated CUT. Once the test pattern is loaded into the integrated CUT, the scan enable signal transitions to a logic low signal and begins the launch and capture phase. In an example, the clock shaper circuit provides the set of clock pulses to the integrated CUT for transition fault testing by the ATE in the launch and capture phase.

In at-speed transition fault testing of the integrated CUT, the logic circuits of the clock shaper circuit operate at the functional clock frequency of the integrated CUT while providing the clock pulses to the integrated CUT such as, for example, clock pulses at the clock frequency of a PLL clock. Further, responsive to the ATE providing the scan enable signal to the integrated CUT, the clock shaper circuit provides, during the launch and capture phase, the clock pulses to the integrated CUT. Therefore, to provide the clock pulses at-speed (e.g., at the functional clock frequency of the integrated CUT) after the scan enable signal is applied to the integrated CU, minimum wait cycles are inserted into the clock shaper circuit that cause the scan enable signal to be applied to the integrated CUT before the clock pulses are applied to the integrated CUT. If the scan enable signal is provided to the integrated CUT before or about the same time the clock pulses are provided to the integrated CUT, the ATE may not be able to perform transition fault testing of the integrated CUT.

Generally, minimum wait cycles in a timing path provide a delay between the time the scan enable signal reaches the integrated CUT and the time the clock pulses are applied to the integrated CUT. A minimum wait cycle for at-speed transition delay fault testing may be implemented by logic circuits that operate at the clock frequency of the integrated CUT. In an example, minimum wait cycles are implemented by pulse generators (e.g., a finite state machine (FSM) or clock cycles from a PLL) in a clock shaper circuit. These FSM or PLL circuits insert timing delays in a timing path of the clock shaper circuit for providing the clock pulses (e.g., clock pulse timing path) after the scan enable signal reaches the integrated CUT. The timing delays delay a time at which the clock shaper circuit initiates generation of the clock pulses based on a trigger signal to later than the time the scan enable is applied to the integrated CUT. In an example, the trigger signal may be a scan enable signal from the ATE. As used herein, the clock pulse timing path is the path between an input and an output with the maximum delay to cause the clock shaper circuit to provide the clock pulses to the integrated CUT and that does not require more time to provide the clock pulses than the available clock cycle. However, clock shaper circuits with FSM or PLL circuits add additional logic depth in the clock pulse timing path. As used herein, logic depth is the sum of the logic gates in the clock pulse timing path which receive the scan enable signal from the ATE as a trigger signal that causes the clock shaper circuit to provide the clock pulses to the integrated CUT. In integrated CUTs with 45 nanometer (nm) CMOS technology (e.g., DSM CMOS technology), the operating frequency is generally in the range of about 1.5 gigahertz (GHz) to about 2.0 GHz. clock shaper circuits with FSMs or PLLs are generally able to provide the clock pulses for at-speed testing of an integrated CUT that operates up to about 1.2 GHz. However, to perform at-speed testing of integrated CUT in the frequency range of about 1.5 GHz to about 2.0 GHz, logic gates may be useful that operate at these higher frequencies. In an example, in the clock pulse timing path, each logic gate may have a programmed delay to the propagating signal of about 100 picoseconds (ps). However, the clock shaper circuits may have to provide the clock pulses in the launch and capture phase with a programmed delay that does not exceed about 500 ps (e.g., for an integrated CUT operating at about 2 GHz). At least some clock shaper circuits based on FSMs or PLLs for at-speed testing at these higher frequencies add additional wait cycles in the clock pulse timing path, causing the logic depth in the clock pulse timing path to exceed 5 (and thereby causing the programmed delay to exceed 500 ps). Further, the logic depth of clock of shaper circuits with FSMs or PLLs at the higher frequencies of about 1.5 GHz to about 2 GHz may not be able to synchronize the scan enable signal with the clock pulses, which can impede at-speed transition fault testing of an integrated CUT in the frequency range of about 1.5 GHz to about 2.0 GHz.

Disclosed herein are examples of a clock shaper circuit that provides clock pulses for at-speed transition fault testing of an integrated CUT. In an example, a clock shaper circuit may provide two clock pulses or multiple clock pulses for transition delay fault testing or a single clock pulse for other fault testing of an integrated CUT. The clock shaper circuit includes logic circuits that operate at a functional clock frequency in the range of about 1.5 GHz to about 2 GHz, such as the functional clock frequency of an integrated CUT. In an example, the clock shaper circuit receives a logic high scan enable signal from an ATE in the shift phase that is useful to load (scan in) test vectors into an integrated CUT, to load clock configuration vectors into the clock shaper circuit, and to provide a synchronized scan enable signal to the integrated CUT. Once the test vectors are loaded, the scan enable signal transitions to a logic low that begins a launch and capture phase of transition fault testing. In an example, the scan enable signal may transition its output to a logic low signal that is useful in the launch and capture phase to trigger the clock shaper circuit to provide a set of clock pulses to the integrated CUT at the functional clock frequency of the integrated CUT. In an example, the synchronizing circuit includes logic circuits that have a logic depth in a clock pulse timing path that may not exceed 2. In an example, the clock shaper circuit provides a number of wait cycles during the launch and capture phase such that the synchronized scan enable signal is provided to the integrated CUT in the shift phase before the set of clock pulses are provided to the integrated CUT in the launch and capture phase.

FIG. 1 is a block diagram of a clock shaper circuit 100 (e.g., a logic circuit) for providing clock pulses, in accordance with various examples. In an example, the clock shaper circuit 100 may provide two clock pulses in a test operation that are applied to an integrated CUT. The clock pulses may correspond to a functional clock frequency of the integrated CUT. While the clock shaper circuit 100 described herein is useful for generating two clock pulses that are applied to an integrated CUT, in various examples any number of clock pulses may be provided by the clock shaper circuit 100 for performing testing of the integrated CUT. In various examples, the clock shaper circuit 100 is implemented as a standalone device (e.g., implemented on its own substrate, enclosed within its own chip package, etc.) or is implemented with the integrated CUT and other electrical devices in a SoC. In an example, the clock shaper circuit 100 provides a two-clock pulse for at-speed transition fault testing of an integrated CUT that operates in a frequency range of about 1.5 GHz to about 2 GHz from signals that are applied to the clock shaper circuit 100 from an external tester 103 (e.g., ATE).

As shown in FIG. 1, the clock shaper circuit 100 includes a synchronizing circuit 104, an integrated clock gating (ICG) circuit 106, a clock leaker circuit 108, an AND gate 110, a shaping ICG circuit 112, a multiplexer (MUX) 114, an AND gate 116, a MUX 118, and inverters 120, 122, 124, and 150. In some examples, the synchronizing circuit 104, an ICG circuit 106, clock leaker circuit 108, AND gate 110, shaping ICG circuit 112, MUX 114, AND gate 116, MUX 118, and inverters 120-124 and 150 are electrically coupled together by way of wires, metal traces on a printed circuit board, metal routing on a silicon substrate, or any other suitable form of conductive coupling. In an example, the clock shaper circuit 100 may receive signals from the external tester 103 (e.g., ATE), which may be coupled to the clock shaper circuit 100 for providing the two clock pulses that are applied to an integrated CUT, such as integrated CUT 102. In some examples, the signals from the external tester 103 may include a shift clock signal (SHIFT_CLK) having a shift frequency, a clock signal (PLL_CLK) having a functional clock frequency that is greater than the shift frequency and that corresponds to an operating frequency of the integrated CUT, clock pulse configuration vectors (CONF_VECTORS), a scan enable signal (SCAN_EN), and transition fault test enable signal (TFT_EN) that may be received by the clock shaper circuit 100 via independent couplings from the external tester 103 to the clock shaper circuit 100.

As shown in FIG. 1, the synchronizing circuit 104 may be coupled to the inverters 120, 122, and 124, and the MUX 118. In an example, the synchronizing circuit 104 includes shift registers 126, 128, 130, and 132 (which may be referred to herein as shift registers 1-M) that are arranged as a cascade of flip-flops. In an example, while the synchronizing circuit 104 is shown with shift registers 1-M, additional shift registers may be implemented. In an example, the shift registers 126, 128, 130, and 132 may be D flip-flops. However, other types of flip-flops may be suitable, such as S-R or J-K type flip-flops. In an example, each output node (e.g., the Q node) of a respective shift register of the shift registers 126-132 is coupled to an input node (e.g., the D node) of an immediately adjacent downstream shift register of the shift registers 128-132. In an example, the output node of shift register 126 is coupled to the input node of shift register 128, the output node of shift register 128 is coupled to the input node of shift register 130, and the output node of shift register 130 is coupled to the input node of shift register 132. While synchronizing circuit 104 is shown with shift registers 126-132, in some examples, additional shift registers similar to the shift registers 126-132 may be included. As explained further below, the shift registers 126-132 are coupled so that an output of the last shift register in the synchronizing circuit 104 (e.g., shift register 132) provides a signal SCAN_EN_SYNC[M] that is based on the SCAN_EN provided by the tester 103 and delayed by a number of cycles of the PLL_CLK equal to the number of shift registers 126-132. This signal SCAN_EN_SYNC[M] is useful to control a clock (LKR_SHIFT_CLK) applied to the clock leaker circuit 108.

The output of the first shift register 126 in the chain of shift registers 126-132 is also coupled to an input of the MUX 118 to provide a signal SCAN_EN_SYNC[0] that is based on SCAN_EN being provided by the tester 103 and delayed by a cycle of the PLL_CLK. In an example, the MUX 118 may be implemented as a 2-to-1 multiplexer with a high-side input node (e.g., input '1'), a low-side input node (e.g., input '0'), a select input node, and an output node. In an example, the logic value at low-side input node will be reflected at the output node in response to the select input node being held to a logic low (e.g., logic 0). In an example, the logic value at high-side input node will be reflected at the output node in response to the select input node being held at a logic high (e.g., logic 1). In an example, the output node of shift register 126 is coupled to the inverters 122 and 124, and to the high-side input node of the MUX 118. The output node of the shift register 132 is coupled to the input node of the inverter 120. In an example, each of the shift registers 126-132 receives PLL_CLK from a PLL or another clock circuit (not shown) coupled to the external tester 103. In an example, PLL_CLK has a same frequency as the functional clock frequency of the integrated CUT. In an example, the PLL_CLK is configured to drive the shift registers 126-132 in the synchronizing circuit 104. In an example, SCAN_EN is applied to the shift register 126 via a scan enable signal line, to the low-side input node of the MUX 118, and to the AND gate 116 via the inverter 150.

In an example, each shift register 126-132 inserts a programmed delay into the clock pulse timing path such that an output signal that is provided from a respective shift register 126-132 meets the timing requirements for generating the two clock pulses in the launch and capture phase. In an example, based on the timing requirements, SCAN_EN is applied to the clock shaper circuit 100 in the shift phase to initiate providing of the two clock pulses during the launch and capture phase. Further, in an example, a synchronized scan enable signal HS_SCAN_EN is provided by the clock shaper circuit 100 to the integrated CUT 102 before the two clock pulses are provided to the integrated CUT 102. In an example, the clock pulse timing path from the synchronizing circuit 104 to the clock leaker circuit 108 includes the programmed delays in logic gates including the shift register 126 and the inverter 124, or the programmed delays in other logic gates including the shift register 132 and the inverter 120.

In an example, the shift register 126 adds a programmed delay to an output signal from the shift register 126 in response to SCAN_EN that is applied at an input node of the shift register 126. In an example, the logic high SCAN_EN initiates loading/shifting the CONF_VECTORS into the clock shaper circuit 100 during the shift phase. In another example, the shift registers 128-132 add additional programmed delays to the output signals that are provided from a respective shift register to an adjacent and downstream shift register 128-132. In an example, each of the shift registers 126-132 provides a programmed delay in lieu of other solutions that include FSMs or PLLs to provide the timing requirements during the launch and capture phases, increasing the logic depth of the clock pulse timing path.

In an example, the clock leaker circuit 108 includes shift registers 134, 136, 138, and 140 (which may be referred to herein as shift registers 1-N) that are arranged as a cascade of parallel-input, serial-output shift registers. In an example, while the clock leaker circuit 108 is shown with shift registers 1-N, additional shift registers may be included. In an example, shift registers 134, 136, 138, and 140 may be implemented as D flip-flops. However, other types of flip-flops such as S-R flip-flops, J-K flip-flops, or a combination of D, S-R, and J-K flip-flops may be included. In an example, each input node (e.g., the D node) of the shift registers 134-140 is coupled to an output node of a respective MUX of the MUXs 142-148 and each output node (e.g., the Q node) of the shift registers 134-140 is coupled to an input node of an adjacent MUX of a downstream shift register. In some examples, the input node of the shift register 134 is coupled to the output node of the MUX 142, and the output node of the shift register 134 is coupled to the low-side input node of the MUX 144, the input node of the shift register 136 is coupled to output node of the MUX 144, and output node of the shift register 136 is coupled to low-side input node of the MUX 146, and the input node of the shift register 138 is coupled to output node of the MUX 146, and the output node of the shift register 138 is coupled to low-side input node of the MUX 148. In an example, an input node of shift register 140 is coupled to the output node of the MUX 148, and the output node of shift register 140 is coupled to the AND gate 110. In an example, the MUXs 142-148 may be implemented as 2-to-1 multiplexers substantially similar to the MUX 118 with a high-side input node (e.g., input 'D1'), a low-side input node (e.g., input 'D0'), a select input node (e.g., select 'S0'), and an output node.

In an example, the high-side input nodes of the MUXs 142-148 are coupled to a data line to receive CONF_VECTORS as '1' or '0' data bits. In an example, CONF_VECTORS include a programmed sequence of data bits having '1' and '0' in which two consecutive '1' bits (e.g., two consecutive logic high bits sequence with leading and trailing zeros may be '001100') may provide the two clock pulses responsive to the CONF_VECTORS that are shifted out of the clock leaker circuit 108 into the shaping ICG circuit 112. In an example, the leading zeros of CONF_VECTORS provide a programmed delay to the shifting out the consecutive '1' bits by clock leaker circuit 108 during the launch and capture phase. The trailing zero may indicate an end to the operation for providing the clock pulses. In an example, other clock pulses may be provided (e.g., a one clock pulse, three clock pulses, or any number of clock pulses) based on a number of the programmed consecutive '1' bits that are to be loaded into the shift registers 134-140 according to CONF_VECTORS. In an example in which three-clock pulses are provided by the clock shaper circuit 100, data vectors that include three consecutive '1' data bits after a set of leading zeros in the CONF_VECTORS may be loaded into the clock leaker circuit 108. In an example, the CONF_VECTORS may provide the two clock pulses responsive to being loaded into the MUXs 142-148 and shifted out based on a clock signal that is applied to the MUXs 142-148.

In an example, the MUXs 142-148 may provide CONF_VECTORS into each of the shift registers 134-140 based on output clock pulses (LKR_SHIFT_CLK), as received at the clock inputs of the MUXs 142-148. In an example, each of the shift registers 134-140 is coupled to an output node of the ICG circuit 106 and receives LKR_SHIFT_CLK from the ICG circuit 106. LKR_SHIFT_CLK drives the shift registers in the clock leaker circuit 108 to load the CONF_VECTORS into the clock leaker circuit 108 and provide the two pulses (e.g., LKR_CLK_OUT) from the clock shaper circuit 100 based on the programmed sequence of data bits.

In an example, the ICG circuit 106 receives PLL_CLK at an input node and receives an enable signal at an enable node from an output of the inverter 120. In an example, the PLL_CLK is configured to drive the shift registers 134-140 in the clock leaker circuit 108 such that clock pulses from the PLL_CLK serially shift the CONF_VECTORS through the shift registers 134-140 in response to a clock gating signal that is deasserted at the clock leaker circuit 108. In an example, the ICG circuit 106 is clock gated (e.g., clock gating signal is asserted) with a logic low enable signal (e.g., ICG circuit 106 is turned OFF with a logic low signal) such that LKR_SHIFT_CLK is not provided at the output node of the ICG circuit 106 (e.g., ICG circuit 106 is clock gated). Clock gating the ICG circuit 106 prevents the LKR_SHIFT_CLK from being applied to the clock nodes of the shift registers 134-140 and prevents serially shifting the data bits through the shift registers 134-140. In an example, the ICG circuit 106 may be ungated with a logic high enable signal to initiate generation of the two clock pulses. In an example, applying a logic high enable signal to the enable node of ICG circuit 106 ungates the ICG circuit 106 (e.g., ICG circuit 106 is turned ON with a logic high signal) and causes LKR_SHIFT_CLK to propagate to the output node of the ICG circuit 106.

In an example, a first input of the AND gate 110 is coupled to the output node of the shift register 126 via the inverter 124, a second input of the AND gate 110 is coupled to the output node of the shift register 140, and a third input of the AND gate 110 is coupled to a transition fault testing signal line to receive a transition fault test enable signal (TFT_EN). In an example, a first input of the AND gate 116 is coupled to the scan enable signal line via the inverter 150 and receives an inverted output of SCAN_EN. In an example, a second input of the AND gate 116 is coupled to the transition fault testing signal line to receive TFT_EN. In an example, TFT_EN is held high during the shift phase and during the launch and capture phase, and does not change its state during at-speed transition fault testing of the integrated CUT 102. In an example, TFT_EN is held low for another test mode such as stuck-at fault testing. In an example, the shaping ICG circuit 112 is coupled at a first input node to the output of the AND gate 110 for receiving an enable signal (LKR_SHAPE_EN) and at a second input node to a clock circuit for receiving the PLL_CLK. The output of the shaping ICG circuit 112 is coupled to a high-side input node of the MUX 114. The low-side input node of the MUX 114 is coupled to a signal line for receiving a SHIFT_CLK, and the output node of the MUX 114 is coupled to the integrated CUT 102. In an example, the MUX 114 may be implemented as a 2-to-1 multiplexer that is substantially similar to the MUX 118 with a high-side input node (e.g., input 'D1'), a low-side input node (e.g., input 'D0'), a select input node (e.g., select 'S0'), and an output node. In an example, SHIFT_CLK is a "slow" clock (e.g., having a clock frequency that is lower than a frequency of PLL_CLK). In an example, SHIFT_CLK is configured to shift the CONF_VECTORS into the clock leaker circuit 108 during the shift phase. In an example, the high-side input node of the MUX 118 is coupled to the output node of the shift register 126 of the synchronizing circuit 104, the low-side input node of the MUX 118 is coupled to the scan enable signal line to receive SCAN_EN, and the output of the MUX 118 is coupled to the integrated CUT 102.

In an example operation, the clock shaper circuit 100 may receive the SCAN_EN. During a shift phase where the SCAN_EN is high, the MUX 114 provides the SHIFT_CLK to the integrated CUT 102 as LKR_CLK_OUT for use in loading (scanning in) a test pattern into latches of the integrated CUT 102. Once the test pattern is loaded into the integrated CUT 102, the SCAN_EN signal transitions and begins a launch and capture phase of, for example, transition fault testing. In an example, the SCAN_EN may transition its output state from a high state (e.g., logic high) to a low state (e.g., logic low) to trigger the clock leaker circuit 108 to provide the set of functional frequency clock pulses as LKR_CLK_OUT. The clock shaper circuit 100 provides the clock pulses in a launch and capture phase after a synchronized scan enable signal (HS_SCAN_EN) is provided to the integrated CUT 102 in the shift phase. In an example, the clock pulses are useful for an external tester to perform transition fault testing of the integrated CUT. In an example, during a transition fault testing mode, a logic high TFT_EN is applied to the AND gate 110 during the shift phase and maintained at logic high during the transition fault testing. In an example, other inputs to the AND gate 110 are at a logic high in the launch and capture phase. The logic high inputs to the AND gate 110 causes the AND gate 110 to provide a logic high signal to the shaping ICG circuit 112, which triggers the shaping ICG circuit 112 to provide LKR_CLK_OUT with the two clock pulses responsive to the PLL_CLK during the duration of the logic high enable signal LKR_SHAPE_EN at the shaping ICG circuit 112. In an example, for stuck-at fault testing of an integrated CUT 102 based on two clock pulses not being useful for testing the integrated CUT 102, the TFT_EN is held at logic low and the SCAN_EN is held at logic high, which is inverted by the inverter 150 to provide a logic low signal to an input of the AND gate 116. The output node of the AND gate 116 is coupled to the MUX 114. In an example, in response to the SCAN_EN being held at logic high, the AND gate 116 provides a logic low signal to the MUX 114. In an example, the logic low signal to MUX 114 causes the PLL_CLK to be bypassed while the SHIFT_CLK is propagated to the integrated CUT 102. The clock shaper circuit 100 disclosed herein is configured to provide a minimum number of wait cycles in a synchronizing circuit based on a scan enable signal that is received such that two clock pulses are provided to an integrated CUT before a synchronized scan enable signal is provided to the integrated CUT 102. In an example, the clock shaper circuit 100 disclosed herein includes logic gates in a clock pulse timing path that does not exceed a logic depth of 2 and provides the two clock pulses that is useful for at-speed transition fault testing of the integrated CUT 102 in the frequency range of about 1.5 GHz to about 2 GHz.

Figure 2:
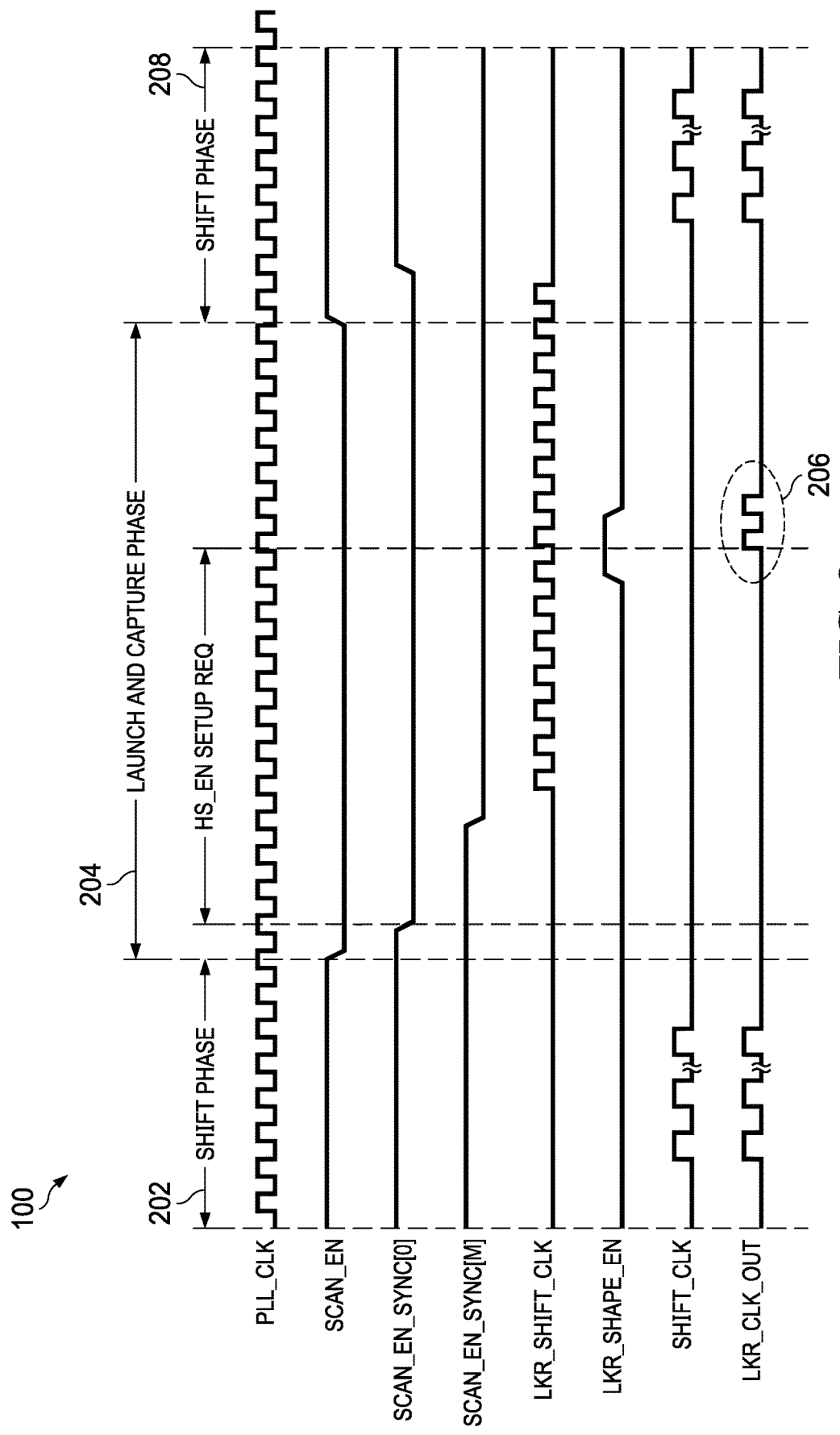
FIG. 2 is a waveform diagram that shows operation of an integrated circuit in accordance with various examples.

FIG. 2 is a waveform diagram 200 that shows a test operation of the clock shaper circuit 100 of FIG. 1, in accordance with various examples. In an example, the test operation includes a shift phase 202 in which a set of test vectors are shifted into shift registers of an integrated CUT 102 according to a scan clock LKR_SHIFT_CLK and provided by a clock shaper circuit 100 to the integrated CUT 102 as a set of clock pulses LKR_CLK_OUT. In an example, the test operation may include loading clock configuration vectors CONF_VECTORS into a clock leaker circuit 108 of the clock shaper circuit 100. The test operation further includes a launch and capture phase 204 in which a set of clock pulses 206 specified by CONF_VECTORS are provided by the clock shaper circuit 100 via LKR_CLK_OUT and based on a transition of SCAN_EN. In an example, an external ATE (e.g., tester 103 in FIG. 1) may provide signals to the clock shaper circuit 100 for implementing the test operation of the clock shaper circuit 100 described herein.

With continued reference to FIG. 1, in the shift phase 202, SCAN_EN is held at a logic high and applied to the clock leaker circuit 108 to shift a set of test vectors into the integrated CUT 102 and to load CONF_VECTORS into the clock leaker circuit 108. In an example, CONF_VECTORS are applied to the clock leaker circuit 108 and the PLL_CLK is applied to the ICG circuit 106. Low frequency pulses from SHIFT_CLK are applied to low-side input node of the MUX 114 during the shift phase 202. In an example, a logic high SCAN_EN is inverted by the inverter 150, which causes the MUX 114 to provide the SHIFT_CLK based on a logic low signal at the select input node of the MUX 114. In an example, CONF_VECTORS are shifted into the MUXs 142-148 of the clock leaker circuit 108 responsive to the SCAN_EN being applied to the synchronizing circuit 108. In an example, the SCAN_EN is a logic high signal and the TFT_EN is a logic high signal. In an example, the logic high SCAN_EN is applied to an input node of the shift register 126 and to the low-side input node of the MUX 118. Further, PLL_CLK is applied to the shift registers 126-132 and to the ICG circuit 106. In an example, PLL_CLK is applied to the clock input of the shift registers 126-132 and to the input node of the ICG circuit 106.

In an example, applying a logic high SCAN_EN to the shift register 126 produces an output signal (SCAN_EN_SYNC[0]), which is a logic high signal at the output node of the shift register 126 responsive to PLL_CLK being applied to the clock input of the shift register 126. In the shift phase 202, the SCAN_EN_SYNC[0] is applied to the input of the inverters 122 and 124, and to the high-side input node of the MUX 118, and TFT_EN is held high. In an example, TFT_EN is applied to the select input node of the MUX 118. A logic high TFT_EN causes SCAN_EN_SYNC[0] at the high-side input node of the MUX 118 to be provided from the output node of the MUX 118 as synchronized scan enable signal HS_SCAN_EN. In an example, based on programmed delays that are configured into the synchronizing circuit 104 and the clock leaker circuit 108, HS_SCAN_EN is provided to the integrated CUT 102 in the shift phase 202 before SCAN_EN that is applied to the clock shaper circuit 100 in the launch and capture phase 204 provides the two clock pulses LKR_CLK_OUT 206 that is provided from the MUX 114.

In an example, in the shift phase 202, the inverters 122 and 124 invert the logic high SCAN_EN_SYNC[0] to a logic low signal. The logic low signals are applied to the select input node of MUXs 142-148 and to the AND gate 110. Applying the logic low signals from inverter 122 to the MUXs 142-148 cause CONF_VECTORS to be loaded into the shift registers 134-140. The data bits in the shift registers 134-140 is not shifted into the shift registers 134-140 until LKR_SHIFT_CLK is applied to each clock input of the shift registers 134-140. As a logic low signal is applied to the enable node of the ICG circuit 106, the ICG circuit 106 is gated OFF and LKR_SHIFT_CLK is not applied as clock signals to the shift registers 134-140 which prevents CONF_VECTORS at the input nodes of the shift registers 134-140 from being serially shifted from the shift register 134 to the shift register 140 and then to the AND gate 110.

In an example, SCAN_EN_SYNC[0] is an output signal at the output node of the first shift register 126 that propagates through shift registers 128-132 during each clock pulse of PLL_CLK. SCAN_EN being logic high causes each shift register 126-132 to output a logic high signal at their respective output nodes with shift register 132 providing a logic high signal SCAN_EN_SYNC[M] at the output node of shift register 132 (e.g., $M^{th}$ shift register). In an example, SCAN_EN_SYNC[M] is a trigger signal that starts the two clock pulse generation by the clock leaker circuit 108.

In an example, the logic high signal at the input node of shift register 128 propagates through the shift registers 128-132 based on receiving clock cycles from PLL_CLK. Each input logic high signal that is provided by the shift registers 128-132 is delayed by a programmed delay by a respective shift register of the shift registers 128-132 in the synchronizing circuit 104. The shift register 126 inserts one programmed delay to the logic high SCAN_EN_SYNC[0] at the output node of the shift register 126, which is applied to the MUX 118. Further, the shift registers 128-132 may add three additional programmed delays to the logic high SCAN_EN_SYNC[M] that is provided at the output node of the shift register 132. The logic high SCAN_EN_SYNC[M] is inverted by the inverter 120, which causes the ICG circuit 106 to be gated OFF and prevents the ICG circuit 106 from providing LKR_SHIFT_CLK.

In an example, during the launch and capture phase 204, SCAN_EN is transitioned from a high state (e.g., logic high) to a low state (e.g., logic low). In an example, a logic low signal is applied at the input node of the shift register 126 that causes SCAN_EN_SYNC[0] at the output node of shift register 126 to transition from a logic high to a logic low during the rising edge of PLL_CLK. After the first cycle (e.g., rising edge) of PLL_CLK, the shift register 126 outputs a logic low SCAN_EN_SYNC[0], which is applied to the input of inverter 122. The inverters 122 and 124 invert the logic low SCAN_EN_SYNC[0] to a logic high signal. The logic high signal from the inverter 122 is applied to the select input nodes of the MUXs 142-148 as an enable signal to shift out the data bits from the shift registers 134-138. The logic high signal from the inverter 124 is applied to the AND gate 110. The logic low SCAN_EN_SYNC[0] at the output node of the shift register 126 propagates through the shift registers 128-132 based on each rising edge of the PLL_CLK. In an example, after the fourth cycle of PLL_CLK, the output node of the shift register 132 provides a logic low SCAN_EN_SYNC[M]. Each logic low signal that is provided by a respective shift register 128-132 is delayed by a programmed delay in the synchronizing circuit 104. The logic low SCAN_EN_SYNC[0] is inverted to a logic high enable signal by the inverter 120, and is applied to the enable node of the ICG circuit 106 as an ungating signal. In an example, the ungating signal at the ICG circuit 106 triggers the clock leaker circuit 108 to shift the CONF_VECTORS to the next shift register in the clock leaker circuit 108 to provide the two clock pulses for transition fault testing in response to a LKR_SHIFT_CLK that is provided to the shift registers 134-140.

In an example, applying ungating signals (e.g., logic high signal) to the enable node of the ICG circuit 106 causes the ICG circuit 106 to provide LKR_SHIFT_CLK. LKR_SHIFT_CLK are clock pulses from PLL_CLK. In an example, the timing requirement for applying ungating signal to the enable node of the ICG circuit 106 may include programmed delays to the signals that propagate through the shift registers 126-132. In an example, the inverter 120 and the ICG circuit 106 may add further propagation delays to the ungating signal applied to the ICG circuit 106. In an example, LKR_SHIFT_CLK that is applied to the clock leaker circuit 108 to provide LKR_CLK_OUT 206 is delayed by a programmed delay based on each delay of the shift registers 128-132.

In an example, LKR_SHIFT_CLK is applied to the clock nodes of shift registers 134-140. Each rising edge of LKR_SHIFT_CLK causes CONF_VECTORS (e.g., data bits '1' or '0') at the input nodes of the shift registers 134-140 to be serially shifted from the shift register 134 to the adjacent shift registers downstream of the shift register and out of the shift register 140. The CONF_VECTORS may be shifted out of the clock leaker circuit 108 into a first input node of the AND gate 110. In an example, the other input nodes of the AND gate 110 receive a logic high signal from the output of inverter 124 and a logic high TFT_EN. In an example, based on consecutive logic high CONF_VECTORS that are provided by clock leaker circuit 108 and while other inputs to the AND gate 110 are logic high, a logic high enable signal LKR_SHAPE_EN is provided at the enable node of the shaping ICG circuit 112, which ungates the shaping ICG circuit 112 and causes PLL_CLK to propagate to the high-side input node of the MUX 114 for the duration of the logic high LKR_SHAPE_EN. In an example, two consecutive logic high data bits in CONF_VECTORS cause the LKR_SHAPE_EN to be logic high for two clock cycles of PLL_CLK and provide two logic high signals to the high-side input node of the MUX 114.

In an example, the inputs of the AND gate 116 receive an inverted output of SCAN_EN and receives TFT_EN. In the launch and capture phase, SCAN_EN is held low while TFT_EN is held high, which causes a logic high signal to be provided from the AND gate 116 to the select input node of the MUX 114. In an example, PLL_CLK at the high-side input node of MUX 114 is reflected on the output node of MUX 114 for the duration of logic high LKR_SHAPE_EN at high side input node of the MUX 114 in response to the select input node of the MUX 114 being at logic high. In an example, in response to consecutive logic '1' CONF_VECTORS being shifted out of the clock leaker circuit 108, a logic high LKR_SHAPE_EN is provided at the enable node of the shaping ICG circuit 112 and causes the MUX 114 to provide two clock pulses of PLL_CLK from the high-side input node of the MUX 114 in response to the select input node of the MUX 114 being at logic high. In an example, the LKR_SHAPE_EN is logic high for two clock cycles of PLL_CLK, which causes the MUX 114 to provide LKR_CLK_OUT as the two clock pulses 206. In an example, the launch and capture phase 204 is followed by another shift phase 208 whereby additional CONF_VECTORS are loaded into the clock shaper circuit 100 and additional two clock pulses are provided based on another launch and capture phase substantially similar to launch and capture phase 204. The clock shaper circuit 100 disclosed herein is configured to provide a minimum number of wait cycles in the launch and capture phase 204 in response to the SCAN_EN that is received such that two clock pulses LKR_CLK_OUT are provided to an integrated CUT 102 before a synchronized scan enable signal HS_SCAN_EN is provided to the integrated CUT 102. In an example, the clock shaper circuit 100 disclosed herein includes logic gates in a clock pulse timing path that does not exceed a logic depth of 2 and provides the two clock pulses that is useful for at-speed transition fault testing of the integrated CUT 102 in the frequency range of about 1.5 GHz to about 2 GHz.

Figure 3:
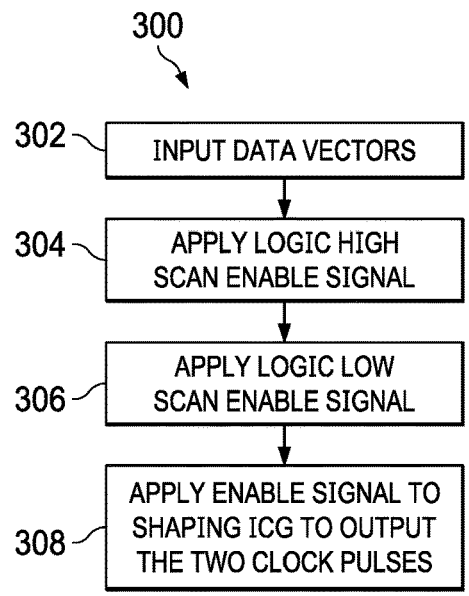
FIG. 3 is a flow diagram of a method for generating clock pulses in an integrated circuit in accordance with various examples.

FIG. 3 is a flow diagram of a method 300 implemented on an integrated circuit, in accordance with various examples. In an example, the method 300 implements a clock leaker operation for generating a set of clock pulses in an integrated circuit. In an example, the integrated circuit is clock shaper circuit 100 that was shown and described in FIG. 1.

With continued reference to FIGS. 1 and 2, in step 302, data vectors are provided to the clock shaper circuit 100. In an example, an external tester 103 (e.g., automatic test equipment) may provide the clock configuration vectors (e.g., CONF_VECTORS in FIG. 1) to the MUXs 142-148 of a clock leaker circuit 108 in the clock shaper circuit 100 during a shift phase.

In step 304, a logic high scan enable signal is applied to the clock shaper circuit 100. In an example, the logic high scan enable signal SCAN_EN is applied to a shift register 126 of a synchronizing circuit 104 and clock pulses PLL_CLK are applied to the clock nodes of the shift registers 126-132 in a shift phase. The logic high SCAN_EN causes the shift register 126 to provide a logic high output signal at the output node of the shift register 126 on a clock pulse PLL_CLK. The logic high output signal provided at the output node of the shift register 126 is inverted by the inverter 122 to a logic low output signal and provided to select input nodes of the MUXs 142-148. The logic low output signal loads CONF_VECTORS into the shift registers 134-140 of the clock leaker circuit 108. In an example, the logic high output signal from the shift register 126 is provided to the high-side input node of the MUX 118. In an example, a logic high TFT_EN in the shift phase causes a logic high output signal at the high-side input node of the MUX 118 to be provided from the output node of MUX 118 as HS_SCAN_EN. In an example, HS_SCAN_EN is applied to the integrated CUT 102 before LKR_CLK_OUT provides the set of clock pulses 206 in the launch and capture phase 204.

In step 306, a logic low scan enable signal is provided at the input to the clock shaper circuit 100 to shift the data bits in the clock leaker circuit 108. In an example, the logic low scan enable signal SCAN_EN is applied to the shift register 126 of the synchronizing circuit 104 and PLL_CLK is applied to the clock nodes of the shift registers 126-132. After the first cycle (e.g., rising edge) of PLL_CLK, the shift register 126 provides a logic low output signal, which is inverted by the inverter 122 to a logic high signal and provided to the select input node of the MUXs 142-148. The logic high signal from the inverter 122 is provided to the select input nodes of the MUXs 142-148 as a gating signal for the MUXs 142-148. A logic low output signal is provided by the shift register 132 based on the fourth cycle of PLL_CLK as a logic low SCAN_EN_SYNC[M] and is inverted to a logic high SCAN_EN_SYNC[M] by the inverter 120. The logic high SCAN_EN_SYNC[M] is provided to the enable node of the ICG circuit 106 as an ungating signal. In an example, LKR_SHIFT_CLK is applied to the clock nodes of the shift registers 134-140 in response to the logic high SCAN_EN_SYNC[M] from the inverter 120 being provided to the enable node of the ICG circuit 106. Each rising edge of LKR_SHIFT_CLK causes CONF_VECTORS (e.g., data bits '1' or '0') at the input nodes of the shift registers 134-140 to be serially shifted from the shift register 134 to the adjacent shift registers downstream of the shift register 134 and out of the shift register 140.

In step 308, LKR_SHAPE_EN is provided to an integrated clock generator (e.g., ICG circuit 112) to cause the clock shaper circuit 100 to provide the two clock pulses. In an example, in response to the CONF_VECTORS being provided to the AND gate 110 as consecutive logic high inputs, a logic high enable signal LKR_SHAPE_EN is provided at the enable node of the shaping ICG circuit 112, which ungates the shaping ICG circuit 112 for two clock cycles of PLL_CLK. In an example, two consecutive logic high data bits in CONF_VECTORS causes the LKR_SHAPE_EN to be logic high for two clock cycles of PLL_CLK and provide two logic high signals to the high-side input node of the MUX 114. In an example, the inputs of the AND gate 116 receive logic high signals. In an example, an input to the AND gate 116 is a logic high signal based on inverting the logic low SCAN_EN by the inverter 150 and another input to the AND gate 116 is a logic high TFT_EN, which causes a logic high signal to be provided from the AND gate 116 to the select input node of the MUX 114. In an example, in response to the select input node of the MUX 114 being kept at logic high, the PLL_CLK at the high-side input node is provided on the output node of the MUX 114 for the duration of the logic high LKR_SHAPE_EN. In an example, the LKR_SHAPE_EN is a logic high for two clock cycles of PLL_CLK, which causes the MUX 114 to provide LKR_CLK_OUT as the set of clock pulses 206.

Figure 4:
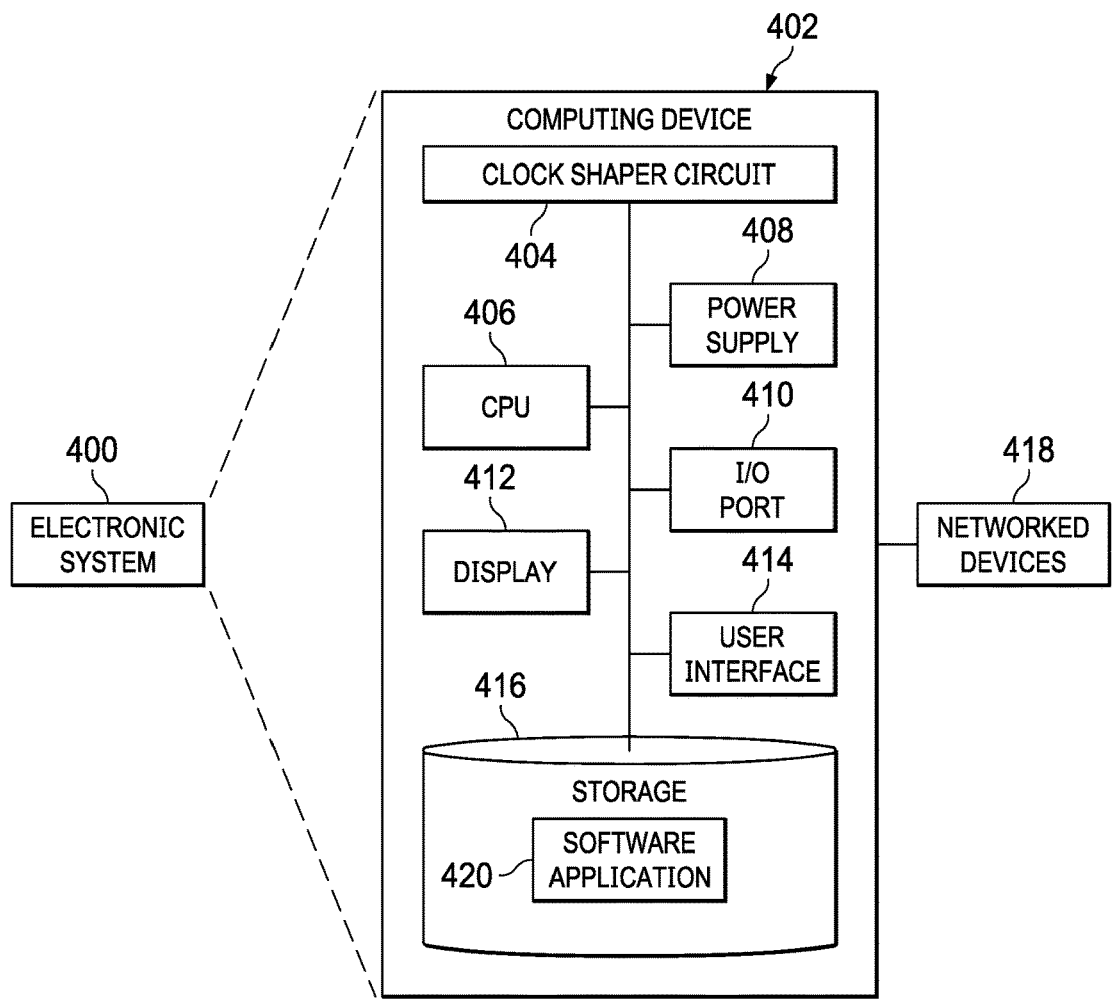
FIG. 4 is a block diagram of a computing device in accordance with various examples.

FIG. 4 is a block diagram of an electronic system 400 in accordance with various examples. For example, the electronic system 400 is, or is incorporated into, or is coupled to, a system such as an automobile, or any type of electronic system operable to process information. In some examples, the electronic system 400 includes a computing device 402 that includes a clock shaper circuit 404, a central processing unit (CPU) 406, a power supply 408, an input-output (I/O) port 410, a display 412, a user interface (UI) 414, a storage 416 (e.g., a random-access memory (RAM)), and a networked devices 418.

In some examples, the clock shaper circuit 404 is clock shaper circuit 100 that was described in FIG. 1 and may be configured to receive clock signals and scan enable signals to provide a set of clock pulses for performing transition fault testing of an integrated CUT.

In some examples, the CPU 406 is a CISC-type (complex instruction set computer) CPU, RISC-type (reduced instruction set computer) CPU, MCU-type (microcontroller unit) CPU, or a digital signal processor (DSP). The CPU 406 includes one or more processor cores. The one or more processor cores are arranged to execute code for transforming the one or more processors into a special-purpose machine or improving the functions of other components in the electronic system 400 to provide a programmed output without performing similar operations on the one or more other processor cores. The CPU 406 includes memory and logic that store information frequently accessed from storage 416.

The CPU 406 and the power supply 408 are coupled to the I/O port 410. In an example, the I/O port 410 provides an interface that is configured to receive input from (and/or provide output to) the networked devices 418.

In an example, a user controls the computing device 402 via the user interface (UI) 414. In an example, during execution of software application 420, a user provides inputs to the computing device 402 via the UI 414, and receives outputs from the computing device 402. In some examples, the outputs are provided via the display 412, indicator lights, a speaker, vibrations and the like. The input is received as audio and/or video inputs (e.g., via voice or image recognition), and electrical and/or mechanical devices such as keypads, switches, proximity detectors, gyros, accelerometers, and the like.

In some examples, the storage 416 is memory such as on-processor cache, off-processor cache, RAM, flash memory, or disk storage for storing one or more software applications 420 (e.g., embedded application), that performs functions associated with the computing device 402 that are described herein in response to executing the one or more software applications 420 by the CPU 406.

The networked device 418 can include any device (including test equipment) capable of point-to-point and/or networked communications with the computing device 402. The computing device 402 is often coupled to peripherals and/or computing devices, including tangible, non-transitory media (such as flash memory) and/or cabled or wireless media. These and other input and output devices are selectively coupled to the computing device 402 by external devices via wireless or cabled connections. The storage 416 is accessible by the networked devices 418. The CPU 406, the storage 416, and the power supply 408 are also optionally coupled to an external power supply (not shown), which is configured to receive power from a power source (such as a battery, solar cell, "live" power cord, inductive field, fuel cell, capacitor, and the like). While not shown in FIG. 4, the power supply 408 includes power generating components. Power generating components include one or more power switches. Each of the power switches is independently controlled for generating power to supply power at various input voltages to various components of the computing device 402. The computing device 402 operates in various power-saving modes wherein individual voltages are supplied (and/or turned off) by the power switches in accordance with a selected power-saving mode and the various components arranged within a specific power domain.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

What is claimed is:

1. An integrated circuit for transition fault testing, comprising:
   a synchronizing circuit including a first set of shift registers coupled to receive a scan enable signal and to provide a synchronizing signal based on the scan enable signal;
   a clock leaker circuit coupled to the synchronizing circuit and including a second set of shift registers coupled to receive a first clock signal based on the synchronizing signal and to provide a second clock signal that includes a set of pulses; and
   a multiplexer (MUX) that includes a first input coupled to receive a shift clock, a second input coupled to the clock leaker circuit to receive the second clock signal, and an output configured to provide an output clock signal that includes a second set of pulses.

2. The integrated circuit of claim 1, wherein the second set of shift registers are coupled to receive clock pulse configuration vectors based on the synchronizing signal and to provide the second clock signal based on the first clock signal.

3. The integrated circuit of claim 2, wherein the clock leaker circuit comprises a first set of MUXs coupled to provide the clock pulse configuration vectors to the second set of shift registers based on the shift clock.

4. The integrated circuit of claim 1, wherein the set of pulses are at a frequency greater than a frequency of the shift clock.

5. The integrated circuit of claim 1, further comprising a second MUX that includes a first input coupled to receive the scan enable signal, a second input coupled to the synchronizing circuit to receive a one-cycle delay scan enable signal from a first shift register of the first set of shift registers, and an output configured to provide a synchronizing scan enable signal based on the one-cycle delay scan enable signal.

6. The integrated circuit of claim 1, further comprising an integrated clock generator (ICG) circuit coupled to the clock leaker circuit and to the synchronizing circuit and configured to provide the first clock signal based on the synchronizing signal.

7. The integrated circuit of claim 6, further comprising a first inverter coupled to the ICG circuit to provide an enable signal to the ICG circuit based on the synchronizing signal.

8. The integrated circuit of claim 1, further comprising an AND gate coupled to the clock leaker circuit and to the synchronizing circuit that includes a first input coupled to receive the second clock signal, a second input coupled to receive a one-cycle delay scan enable signal, a third input coupled to receive a transition fault test enable signal, and an output coupled to provide the second clock signal.

9. The integrated circuit of claim 1, further comprising a shaping integrated clock generator (ICG) circuit coupled to the MUX that includes a first input coupled to receive a third clock signal, a second input coupled to receive the second clock signal, and an output coupled to provide the output clock signal.

10. The integrated circuit of claim 9, wherein the third clock signal is at a frequency greater than a frequency of the shift clock.

11. A method implemented by an integrated circuit, comprising:
    receiving, by a synchronizing circuit, a scan enable signal;
    providing, by the synchronizing circuit, a synchronizing signal based on the scan enable signal;
    receiving, by a clock leaker circuit, a first clock signal based on the synchronizing signal;
    providing, by the clock leaker circuit, a second clock signal that includes a set of pulses;
    receiving, by a multiplexer (MUX), a shift clock at a first input of the MUX and a second clock signal at a second input of the MUX; and
    providing, by the MUX, an output clock signal that includes a second set of pulses at an output of the MUX.

12. The method of claim 11, further comprising:
    receiving, by the synchronizing circuit, clock pulse configuration vectors based on the synchronizing signal; and
    providing, by the synchronizing circuit, the second clock signal based on the first clock signal.

13. The method of claim 12, further comprising providing, by the clock leaker circuit, the clock pulse configuration vectors to the clock leaker circuit based on the shift clock.

14. The method of claim 12, wherein the set of pulses are at a frequency greater than a frequency of the shift clock.

15. The method of claim 11, further comprising:
receiving, by a second MUX, the scan enable signal at a first input of the second MUX and a one-cycle delay scan enable signal at a second input of the second MUX; and
providing, by the second MUX, a synchronizing scan enable signal based on the one-cycle delay scan enable signal at an output of the second MUX.

16. The method of claim 11, further comprising providing, by an integrated clock generator (ICG) circuit, the first clock signal based on the synchronizing signal.

17. The method of claim 16, further comprising providing, by a first inverter, an enable signal based on the synchronizing signal.

18. The method of claim 11, further comprising:
receiving, by an AND gate, the second clock signal at a first input of the AND gate, a one-cycle delay scan enable signal at a second input of the AND gate, and a transition fault test enable signal at a third input of the AND gate; and
providing, by the AND gate, the second clock signal at an output of the AND gate.

19. The method of claim 11, further comprising
receiving, by a shaping integrated clock generator (ICG) circuit, a third clock signal at a first input of the shaping ICG and the second clock signal at a second input of the shaping ICG; and
providing, by the shaping ICG, the output clock signal at an output of the shaping ICG.

20. The method of claim 19, wherein the third clock signal is at a frequency greater than a frequency of the shift clock.

* * * * *